US012352790B2

(12) United States Patent
Sun et al.

(10) Patent No.: US 12,352,790 B2
(45) Date of Patent: Jul. 8, 2025

(54) RF POWER AMPLIFIER INTEGRATED CIRCUIT HAVING PRECISION POWER DETECTOR

(71) Applicant: Microwave Technology Inc., Fremont, CA (US)

(72) Inventors: Howard J. Sun, Newark, CA (US); Guo-Gang Zhou, Kentfield, CA (US)

(73) Assignee: Microwave Technology Inc., Fremont, CA (US)

( * ) Notice: Subject to any disclaimer, the term of this patent is extended or adjusted under 35 U.S.C. 154(b) by 191 days.

(21) Appl. No.: 17/965,735

(22) Filed: Oct. 13, 2022

(65) Prior Publication Data

US 2024/0125831 A1    Apr. 18, 2024

(51) Int. Cl.
| | | |
|---|---|---|
| *G01R 21/14* | (2006.01) | |
| *H03F 1/30* | (2006.01) | |
| *H03F 3/24* | (2006.01) | |

(52) U.S. Cl.
CPC ............... *G01R 21/14* (2013.01); *H03F 1/30* (2013.01); *H03F 3/245* (2013.01); *H03F 2200/451* (2013.01)

(58) Field of Classification Search
CPC ........... G01R 21/14; G01R 21/10; H03F 1/30; H03F 3/245; H03F 3/195; H03F 2200/451
See application file for complete search history.

(56) References Cited

U.S. PATENT DOCUMENTS

| | | | | | |
|---|---|---|---|---|---|
| 4,797,556 | A | * | 1/1989 | Marzari | H04B 10/07 250/214 RC |
| 5,343,404 | A | * | 8/1994 | Girgis | G01R 25/00 708/422 |
| 5,677,602 | A | * | 10/1997 | Paul | H05B 41/2881 315/307 |
| 7,071,783 | B2 | * | 7/2006 | Ichitsubo | H03G 3/3042 330/296 |

(Continued)

OTHER PUBLICATIONS

HMC7543 Data Sheet, "71 GHz to 76 GHZ, E-Band Power Amplifier With Power Detector," Rev A., Analog Devices, 16 pages (2016). (Year: 2016).*

(Continued)

*Primary Examiner* — Christopher P McAndrew
(74) *Attorney, Agent, or Firm* — Imperium Patent Works LLP; T. Lester Wallace

(57) ABSTRACT

An integrated circuit includes a power amplifier and a power detector. The power detector has a VDET node and a VREF node. A first filter coupled to the VDET node outputs a signal VDET onto a VDET terminal. A second filter coupled the VREF node outputs a signal VREF onto a VREF terminal. The signals VDET and VREF are generated so that the voltage difference between the two signals varies in proportion to the RF output power magnitude with an accuracy of ±0.1 decibels over a −45° C. to +85° C. temperature range. An amount of the RF signal as output by the power amplifier is coupled onto the VDET node and is detected by a half-wave rectifying RF detector diode. The diode has a (Continued)

MMIC POWER AMPLIFIER INTEGRATED CIRCUIT WITH PRECISION POWER DETECTOR capacitance that increases with temperature, so a temperature compensation circuit that has an admittance that decreases with temperature is coupled in parallel with the detector diode.

23 Claims, 4 Drawing Sheets

(56) References Cited

U.S. PATENT DOCUMENTS

| | | | | |
|---|---|---|---|---|
| 2001/0007151 | A1* | 7/2001 | Vorenkamp | H10D 89/60 |
| | | | | 348/731 |
| 2004/0176058 | A1* | 9/2004 | Johnson | H03D 7/1483 |
| | | | | 455/147 |
| 2004/0198257 | A1* | 10/2004 | Takano | H03G 3/3047 |
| | | | | 455/108 |
| 2010/0007419 | A1* | 1/2010 | Gilbert | H03F 3/211 |
| | | | | 330/254 |
| 2011/0018624 | A1 | 1/2011 | Kobayashi et al. | 327/574 |
| 2020/0271699 | A1* | 8/2020 | Khatib | H03F 3/211 |

OTHER PUBLICATIONS

Bhagavatula, Venumadhav, et al. "A 5G FR2 power-amplifier with an integrated power-detector for closed-loop EIRP control." IEEE Journal of Solid-State Circuits 57.5 (2022): 1257-1266. (Year: 2022).*

Francois, Brecht, and Patrick Reynaert. "A fully integrated transformer-coupled power detector with 5 Ghz RF PA for WLAN 802.11 ac in 40 nm CMOS." IEEE Journal of Solid-State Circuits 50.5 (2015): 1237-1250. (Year: 2015).*

HMC7543 Data Sheet, "71 GHz to 76 GHz, E-Band Power Amplifier With Power Detector," Rev A., Analog Devices, 16 pages (2016).

MAAP-011146-DIE Data Sheet, "Power Amplifier, 3 W, 21.15-23.65 GHz", Rev. V1, Macom Technology Solutions, 7 pages.

"AN02 Microsemi MMIC Amplifiers with On-Chip Power Detectors," Rev. C, Microsemi Corporation, 7 pages (Oct. 2014).

XP1017-BD Data Sheet, 30.0-36.0 GHz GaAs MMIC Power Amplifier, Rev. 23, Mimix Broadband, 8 pages (Jan. 2010).

XP1039-QJ Data Sheet, 2.5 W Power Amplifier 5.6-7.1 GHZ, Rev. V1, Macom Technology Solutions, 8 pages.

MMA-273336-M5 Data Sheet, MWT 27-33GHz 4W MMIC Power Amplifier, Microwave Technology Inc., 10 pages (May 2018).

MMA-061827 Preliminary Data Sheet, MWT 6-18 GHz Power Amplifier MMIC Chip, Microwave Technology Inc., 5 pages (Jun. 2008).

MMA-283136 Data Sheet, MWT 28-31 GHz 4W MMIC Power Amplifier, Microwave Technology Inc., 10 pages (Nov. 2012).

AN-653 Application Note, "Improving Temperature, Stability, and Linearity of High Dynamic Range RMS RF Power Detectors," Analog Devices, Rev. A, 8 pages (2003).

* cited by examiner

MMIC POWER AMPLIFIER INTEGRATED CIRCUIT WITH PRECISION POWER DETECTOR CONNECTED TO EXTERNAL DIFFERENTIAL AMPLIFIER

RF DETECTOR DIODE CAPACITANCE
VERSUS TEMPERATURE

RESISTANCE OF TEMPERATURE COMPENSATION CIRCUIT
VERSUS TEMPERATURE

GaAs PHMET MESA RESISTOR
250 OHMS/SQUARE
271 OHMS AT -45°C
325 OHMS AT +85°C

|  | PA Output Power | Temp Range | Operating Frequency (RFOUT) | Power Reading Inaccuracy (VREF-VDET) |
|---|---|---|---|---|
| Power Detector Circuit Of FIG. 2 With Temp Comp Circuit 56 | +35dBm | -45°C to +85°C | 28GHz to 30 GHz | ±0.10 dB |
| Power Detector Circuit Of FIG. 2 Without Temp Comp Circuit 56 | +35dBm | -45°C to +85°C | 28GHz to 30 GHz | ±0.66 dB |

RF POWER AMPLIFIER INTEGRATED CIRCUIT HAVING PRECISION POWER DETECTOR

TECHNICAL FIELD

The described embodiments relate to RF power amplifier integrated circuits that have power detector circuitry, and to related structures and methods.

BACKGROUND INFORMATION

High frequency power amplifier integrated circuits usable for amplifying high frequency Radio Frequency (RF) signals often include an associated power detector circuit. The power detector circuit generally outputs a voltage signal VDET onto a VDET terminal of the integrated circuit. The magnitude of this voltage signal VDET is related to the magnitude of RF output power being output by the power amplifier. The output signal VDET as output onto the VDET terminal may include what is effectively a Direct Current (DC) offset error voltage. Such integrated circuits therefore also may output, in addition to the voltage signal VDET on the VDET terminal, a reference signal VREF onto a VREF terminal of the integrated circuit. The reference signal VREF is the same as or as similar as possible to the unwanted DC offset error voltage component of the output signal VDET. Circuitry external to the integrated circuit can use the VREF signal to remove the DC offset error voltage from the voltage signal VDET, thereby generating a signal whose magnitude is directly proportional to the power of the RF output signal being output by the power amplifier of the integrated circuit.

The HMC7543 power amplifier integrated circuit (71 GHz-76 GHz, E-band) available from Analog Devices, Inc., of Norwood, Massachusetts is an example of one such high frequency power amplifier circuit. The HMC7543 integrated circuit has an RF IN terminal, and RF OUT terminal, a VDET terminal, and a VREF terminal. As explained in a data sheet for the HMC7543, a coupler at the output of the last stage of the power amplifier taps off a small portion of the RF output signal. The coupled signal is presented to an on-chip diode detector for external monitoring of the RF output power. A matched reference diode is included to help correct for detector temperature dependencies. It is believed that the accuracy of conventional power detectors over temperature (for example, over a temperature range from −45° C. to +85° C.) is not better than ±0.66 dB when RF output power is at its specified maximum.

SUMMARY

A high frequency power amplifier integrated circuit usable to amplify high frequency Radio Frequency (RF) signals includes a power amplifier and an associated power detector circuit. The power amplifier outputs an RF output signal onto an RFOUT terminal of the integrated circuit. The RF output signal may, for example, be a 3.0 watt 30 GHz signal. The integrated circuit further includes a terminal VDET and a terminal VREF. The power detector circuit outputs a detector output signal VDET onto the terminal VDET. This detector output signal VDET has a Direct Current (DC) reference voltage component VREF and a DC RF output power detect component VF. The power detector circuit also outputs a reference signal VREF onto the terminal VREF. The two signals VDET and VREF are generated such that a voltage difference VF between the reference signal VREF on the terminal VREF and the detector output signal VDET on the terminal VDET varies in direct proportion to the power magnitude of the RF output signal on the RFOUT terminal within an accuracy of less than or equal to plus or minus 0.1 decibels ($\leq \pm 0.1$ dB) over a temperature range of from minus forty-five degrees Celsius to plus eighty-five degrees Celsius.

In one embodiment, a millimeter wave Monolithic Microwave Integrated Circuit (MMIC) power amplifier integrated circuit includes a power amplifier and a power detector circuit. The power amplifier outputs an RFOUT signal (for example, a 3.0 watt 30 GHz signal) onto a RFOUT terminal of the integrated circuit. The power detector circuit has a voltage detector node VDET, a coupling circuit that couples an amount of RF output signal output by the power amplifier onto the node VDET, an RF detector diode that has an anode coupled to the VDET node and a cathode coupled to a ground node, a first low-pass filter, and a novel temperature compensation circuit that provides an admittance between the VDET node and the ground node. The first low-pass filter is coupled to the VDET node and outputs the detector output signal VDET onto the terminal VDET. Whereas the capacitance of the RF detector diode increases with increasing temperature (for example, over a temperature range from −45 degrees Celsius to +85 degrees Celsius), the admittance of the novel temperature compensation circuit decreases with respect to increasing temperature over the same temperature range. In one example the temperature compensation circuit includes a resistor coupled in series with a capacitor. The resistance of the resistor has a positive temperature coefficient over the temperature range. The resistor may, for example, be realized as a pseudomorphic High Electron Mobility Transistor (pHMET) mesa resistor.

The power detector circuit further comprises a second diode that has an anode coupled to node VREF and a cathode coupled to the ground node, a capacitor that provides a capacitance between the node VREF and the ground node, and a second low-pass filter. The second low-pass filter is coupled to the VREF node and outputs the reference signal VREF onto the terminal VREF.

The power detector circuit further comprises a first bias resistor and a second bias resistor. The first bias resistor is coupled between a supply voltage node (for example, a +6.0 volt VDD supply voltage node) and the node VDET. The resistance of this first bias resistor is selected so that the voltage on the VDET node is DC-biased to about 0.6 volts. Likewise, the second bias resistor is coupled between the supply voltage node and the node VREF. The resistance of this second bias resistor is selected so that the voltage on the VREF node is DC-biased to about 0.6 volts.

In one exemplary use of the millimeter wave MIMIC power amplifier integrated circuit, the power detector output signal VDET (as output by the power detector circuit onto the terminal VDET) is subtracted from the reference signal VREF (as output by the power detector circuit onto the terminal VREF) so as to generate a highly accurate power detect signal VF. The magnitude of this signal VF is directly proportional to the power magnitude of the RF output signal being output by the power amplifier onto the RFOUT terminal of the integrated circuit. In one example, the power reading inaccuracy of this signal VF is less than ±0.10 dB over a temperature range of from −45° C. to +85° C., when the power amplifier is providing +35 dBm of output power, for an RFOUT signal frequency anywhere in the frequency range from 28 GHz to 30 GHz.

Further details and embodiments and techniques are described in the detailed description below. This summary does not purport to define the invention. The invention is defined by the claims

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings.

Figure 1:
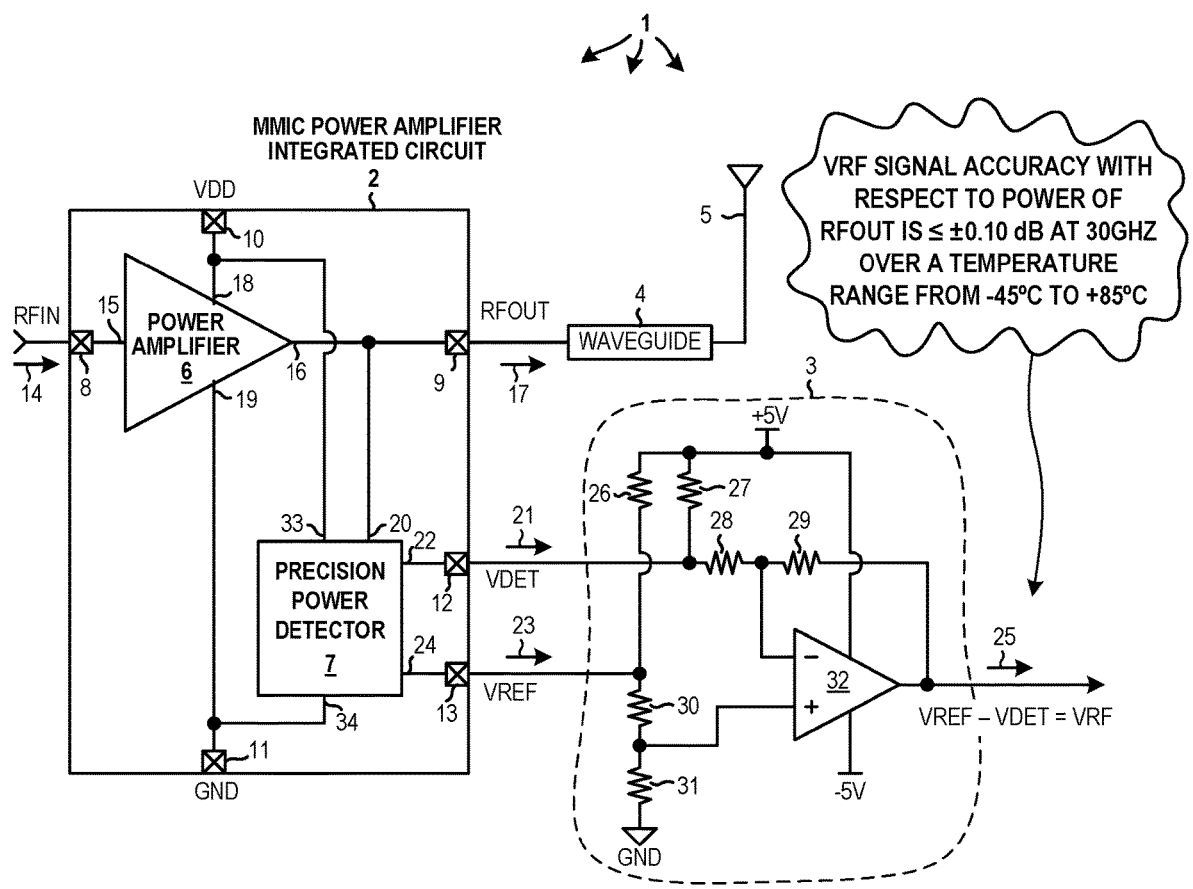
FIG. 1 is a diagram of a system 1 involving a millimeter wave MIMIC power amplifier integrated circuit 2 and an external differential amplifier circuit 3.

FIG. 1 is a diagram of a system 2 involving a millimeter wave Monolithic Microwave Integrated Circuit (MMIC) power amplifier integrated circuit 2, an external differential amplifier circuit 3, a waveguide 4, and an antenna 5. The term millimeter wave refers generally to a circuit that operates at frequencies in the millimeter wavelength range, namely thirty gigahertz to three-hundred gigahertz. In the illustrated example, the millimeter wave MIMIC power amplifier integrated circuit 2 has a gallium-arsenide substrate and includes a 3.0 watt 29 dB gain power amplifier 6, a precision power detector 7, a Radio Frequency (RF) input terminal RFIN 8, an RF output terminal RFOUT 9, a supply voltage terminal VDD 10, a ground terminal GND 11, a power detector output terminal VDET 12, and a reference signal output terminal VREF 13. The power amplifier 6 receives an RF input signal 14 via terminal RFIN 8 and power amplifier input lead 15, and amplifies it, and outputs an RF output signal via power amplifier output lead 16 and terminal RFOUT 9. RF input signal 14 and RF output signal 17 may, for example, be thirty gigahertz signals. The power amplifier 6 is receives supply voltage VDD (for example, +6.0 volts DC) via input lead 18 from supply voltage terminal VDD 10. The power amplifier is coupled to ground via lead 19 and ground terminal GND 11. The RF output signal RFOUT 17 as output from the MMIC power amplifier integrated circuit 2 has a power magnitude. This power magnitude is the product of the RMS voltage of the RFOUT signal 17 on the RFOUT terminal 9 and the RMS current of the RFOUT signal 17 flowing through the RFOUT terminal 9. In the illustrated example, the RF output signal 17 passes through waveguide 4 and to antenna 5 for transmission.

The precision power detector 7 is coupled to receive an amount of the RF output signal via input lead 20. The circuitry of the precision power detector 7 is powered from supply voltage VDD received VDD terminal 10 via supply voltage lead and node 33. The precision power detector 7 is grounded via ground lead 34 and ground terminal 11. From the RF signal received via input lead 20 the precision power detector 7 generates: 1) a detector output signal VDET 21 that is output via output lead 22 and power detector output terminal VDET 12, and 2) a reference signal VREF 23 that is output via output lead 24 and reference signal output terminal VREF 13. The detector output signal VDET 21 is a voltage signal that has two Direct Current (DC) voltage components: 1) a DC reference voltage component VREF, and 2) a DC output power detect component VF. The magnitude of the component VF varies in inverse proportion to the power magnitude of the RF output signal 17. Accordingly, the larger the power magnitude of the RF output signal 17, the more negative the voltage of component VF becomes.

The external differential amplifier circuit 3 outputs a DC signal VRF 25 by subtracting the signal VDET 21 on terminal VDET 12 from the signal VREF 23 on VREF terminal 13. Because the magnitude of DC component VF of the signal VDET 21 varies in inverse proportion the power magnitude of the RF output signal 17, and because the differential amplifier circuit 3 subtracts the signal VDET 21 from the signal VREF 23, the signal VRF 25 as output by the differential amplifier circuit 3 varies in direct proportion with respect to the power magnitude of the RF output signal 17. The external differential amplifier circuit 3 includes resistors 26-31 and differential amplifier 32. Due to the precision of the novel precision power detector 7, the signal VRF 25 as output by the differential amplifier circuit 3 has an accuracy with respect to the power magnitude of the signal RFOUT 17 that is less than or equal to plus or minus 0.10 decibels (≤±0.10 dB) over the temperature range of from minus forty-five degrees Celsius to plus eighty-five degrees Celsius, for an RFOUT frequency anywhere in the frequency range from 28 GHz to 30 GHz.

Figure 2:
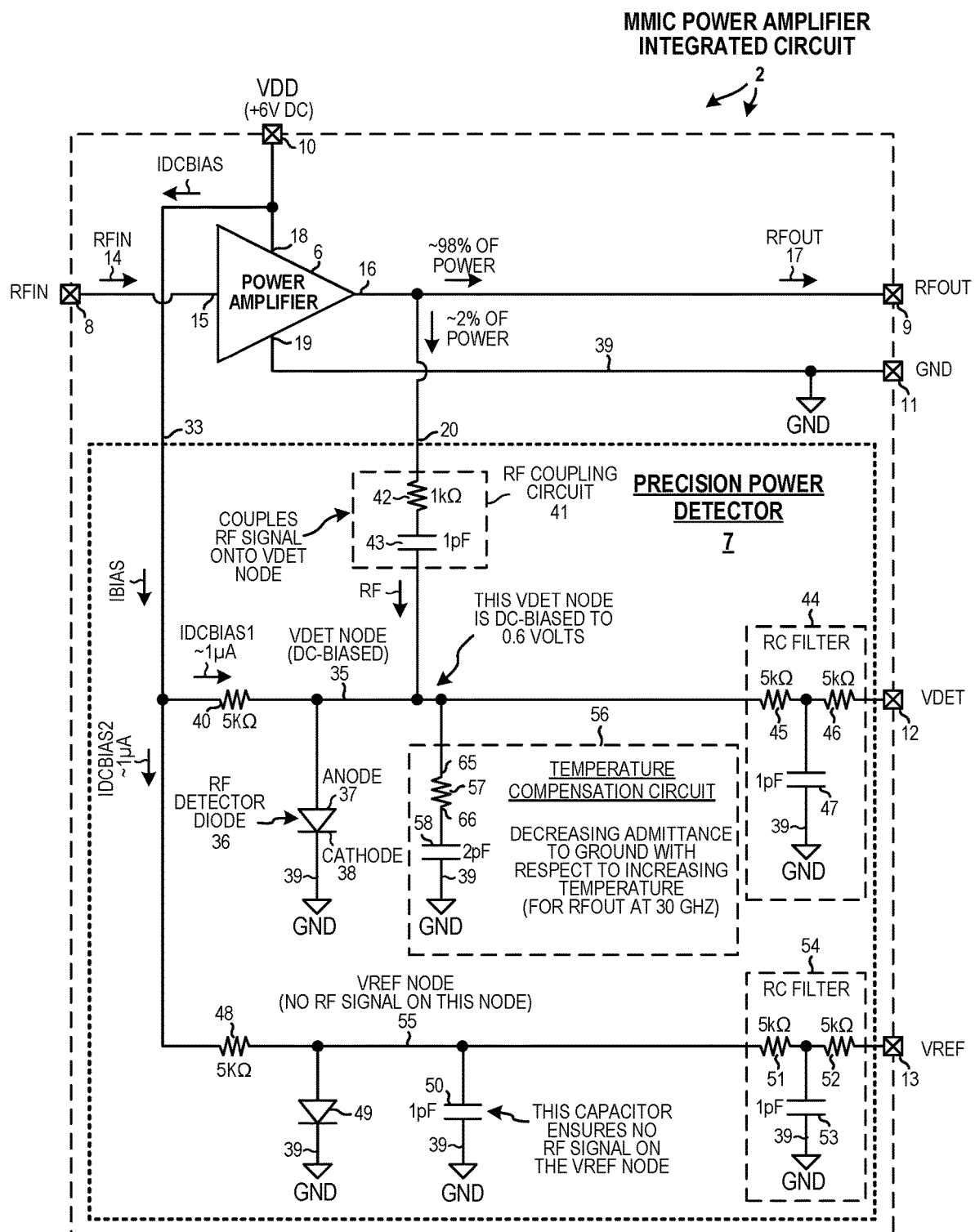
FIG. 2 is a diagram of the millimeter wave MIMIC power amplifier integrated circuit 2 of FIG. 1, where the precision power detector 7 of the millimeter wave MMIC power amplifier integrated circuit 2 includes a temperature compensation circuit 56.

FIG. 2 is a more detailed circuit diagram of the MMIC power amplifier integrated circuit 2. The precision power detector 7 includes a VDET node 35 and a half-wave rectifying RF detector diode 36. The voltage on the VDET node 35 is DC-biased to a DC voltage that is slightly above the forward voltage of the RF detector diode 36. In the present example, the VDET node is biased to 0.6 volts, with a DC bias current of about one microampere flowing through the RF detector diode 36. The anode 37 of the RF detector diode 36 is coupled to the VDET node 35. The cathode 38 of the RF detector diode 36 is coupled to ground node 39. There is an amount of static DC current flow from the VDET node 35 to ground due to the various components that are coupled between the VDET node 35 and ground. The resistance of the bias resistor 40 is selected so that the voltage drop across the bias resistor 40 from the VDD supply voltage (for example, +6.0 volts DC) sets the bias voltage on VDET node 35 to be 0.6 volts.

In addition to this DC bias voltage, the signal on VDET node 35 also has an AC signal component. This AC signal component is due to an amount of the RFOUT signal on the output of the power amplifier 6 being coupled through an RF coupling circuit 41 onto the VDET node 35. The RF coupling circuit 41 includes a resistor 42 and a capacitor 43 coupled in series. In the present example, the RF coupling circuit 41 couples about two percent of the RF power of the RFOUT signal (as output by power amplifier 6) onto the VDET node 35. The remaining ninety-eight percent of the power of the RFOUT signal (as output by power amplifier 6) is supplied out of the MIMIC power amplifier integrated circuit 2 via the RFOUT terminal 9.

The positive portions of the AC RF signal coupled onto the VDET node 35 are shunted to ground node 39 by RF detector diode 36. Negative portions of the AC RF signal, on the other hand, are not shunted. The RF detector diode 36 operates as a half-wave rectifier. As a consequence, there is a negative AC RF signal on the VDET node 35. The RMS magnitude of this negative AC RF signal is inversely proportional to the power magnitude of the RFOUT signal 17. The precision power detector 7 further includes a low-pass filter 44. This low-pass filter 44 filters the negative AC signal from VDET node 35 such that the DC detector output signal VDET 21 is generated and is supplied onto the VDET terminal 12. The detector output signal VDET 21 has a magnitude that is proportional to the RMS amplitude of the AC RF signal on VDET node 35. Filter 44 includes resistors 45 and 46 and a capacitor 47. Accordingly, the VDET signal 21 on the VDET terminal 12 involves two components: 1) a DC component due to the DC biasing of VDET node, and 2) a DC component due an amount of the RF output signal from the power amplifier having been coupled onto the VDET node 35 by the RF coupling circuit 41. As indicated in the circuit of FIG. 1, it is the second component that is desired because it is this second component whose magnitude is inversely proportional to the power magnitude of the RFOUT signal 17. The detector output signal VDET, however, in addition to the wanted second component includes the unwanted DC component due to the DC-biasing of the VDET node. In order to be able to subtract the unwanted DC component from the VDET signal, a reference signal VREF is generated that is as similar as possible to the unwanted DC component of signal VDET. In order to generate this signal, the precision power detector 7 includes a VREF node 55. The VREF node 55 is made to be as similar to VDET node 35 as possible, but there is no RF signal coupled onto this node. A second diode 49, that is matched to and is structurally identical to and is located close to the RF detector diode 36, is provided. This second diode 49 is tightly thermally coupled to RF detector diode 36. This second diode 49 is DC-biased at the same one microampere of bias current as is the RF detector diode 36. In the same way that the VDET node 35 has an associated bias resistor 40, so too does the VREF node 55 have an associated bias resistor 48. The bias resistor 48 is sized so as to DC-bias the VREF node to 0.6 volts in the same way that the bias resistor 40 is sized to DC-bias the VDET node 35 to 0.6 volts. A capacitor 50 is provided to couple any RF signal on the VREF node 55 to ground node 39, thereby ensuring that there is no RF signal present on the VREF node 55. As a result, the DC voltage present on VREF node 55 is the same as the DC voltage component of the signal present on VDET node 35. The changing effects of the RF detector diode 36 on the DC-bias voltage on the VDET node 35 (such as due to diode capacitance changes with temperature, and due to diode characteristic variations over process) are the same on the VREF node 55 because the second diode 49 has the same effect on the DC-bias voltage on the VREF node 55. Filter 54 is identical to filter 44. In the same way that a low-pass filtered version of the signal on VDET node 35 is output onto the VDET terminal 12 by filter 44, so too is a low-pass filtered version of the signal on VREF node 55 output onto the VREF terminal 13 by filter 54. The resulting reference signal VREF 23 present on terminal VREF 13 is therefore identical to the unwanted DC component of the VDET signal 21 present on VDET terminal 12.

It has been recognized that the VREF node circuitry described above is usable to generate a reference signal VREF that can be used to cancel out temperature dependent diode performance changes for DC-bias purposes, but that the VREF node circuitry does not compensate for changes in RF detector diode operation as far as influence on the high frequency signal on the VDET node 35 is concerned. The capacitance of the RF detector diode 36 varies substantially over temperature and this change affects the accuracy of the detector output signal, even if the frequency of the signal RFOUT 17 remains fixed.

Figure 3:
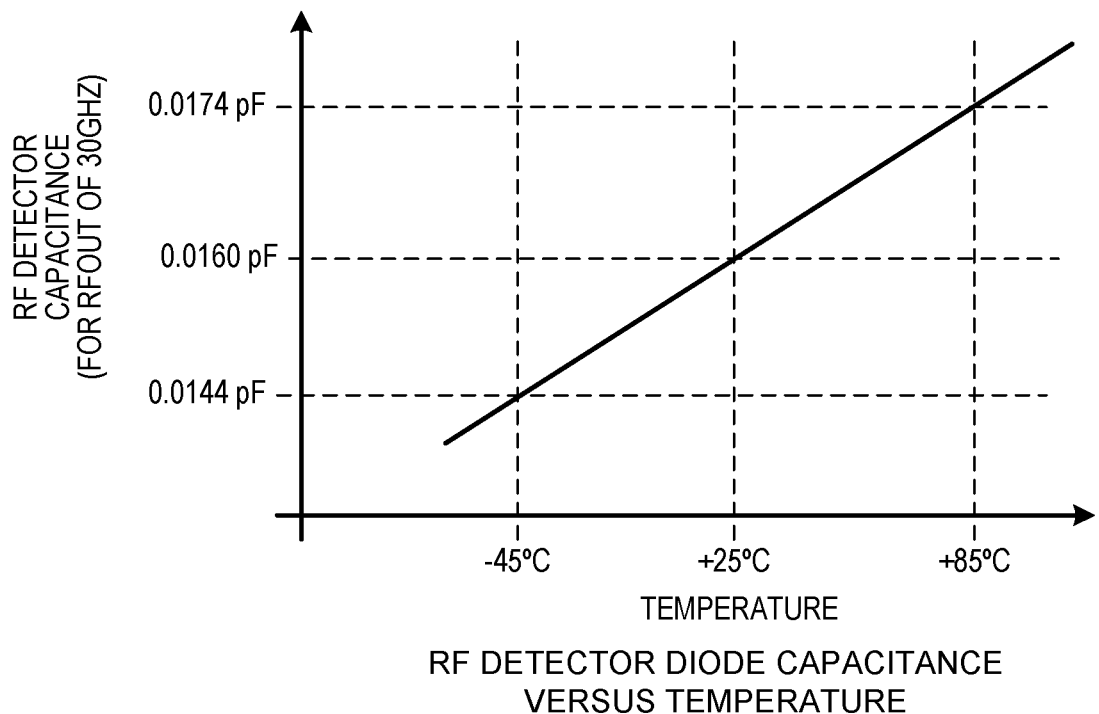
FIG. 3 is simplified diagram that shows how the capacitance of the RF detector diode 36 of the precision power detector 7 increases with increasing temperature.

FIG. 3 is a simplified diagram illustrating how the capacitance of the RF detector diode 36 increases with temperature, where the frequency of RFOUT is constant at 30 GHz. At plus eighty-five degrees Celsius the capacitance of the RF detector capacitor 36 is 0.0174 picofarads, whereas at minus forty-five degrees Celsius the capacitance of the RF detector capacitor 36 is 0.0144 picofarads, where the frequency of RFOUT is constant at 30 GHz, and VDD is constant and stable at +6.0 volts. If this temperature dependent capacitance change were not compensated in the power detector circuitry, then at increasing temperatures the admittance from the VDET node 35 to the ground node 39 would increase with temperature. This would adversely affect the accuracy of the power detector.

Figure 4:
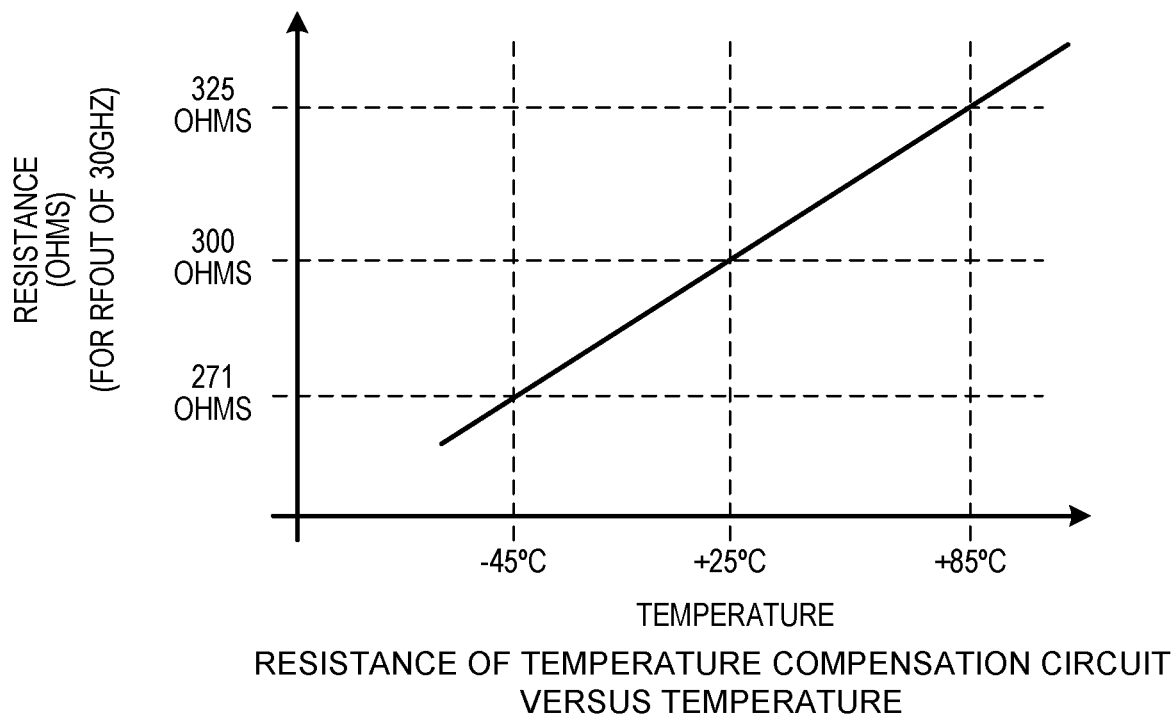
FIG. 4 is a simplified diagram that shows how the resistance of the temperature compensation circuit 56 of the precision power detector 7 increases with increasing temperature.

In accordance with a novel aspect of this invention, the novel precision power detector 7 further includes a temperature compensation circuit 56. The temperature compensation circuit 56 is coupled between the VDET node 35 and ground node 39. The temperature compensation circuit 56 has a decreasing admittance to ground with respect to increasing temperature. Because the temperature compensation circuit 56 is coupled in parallel with the RF detector diode 36, the decreasing admittance with respect to temperature of the temperature compensation circuit 56 can be made to offset and to counteract the effect of the increasing admittance with respect to temperature of the RF detector diode 36. FIG. 4 is a diagram illustrating how the resistance of the temperature compensation circuit 56 increases with respect to temperature.

Temperature compensation circuit 56 can be realized using multiple different types of circuits. In one specific embodiment, temperature compensation circuit 56 includes a resistor 57 and a capacitor 58. Resistor 57 and capacitor 58 are connected in series between the VDET node 35 and the ground node 39. The resistance of resistor 57 has a positive temperature coefficient, and more specifically in this embodiment has a positive temperature coefficient of +0.14%/° C. Namely, the resistance of resistor 57 increases as the temperature of the resistor increases, as indicated in the graph of FIG. 4. The capacitor 58 is a virtual open circuit for DC, so the temperature compensation circuit 56 has no effect on the DC biasing of VDET node 35.

Although the RF detector diode 36 and the matching reference diode 49 in the specific illustrated example of FIG. 2 are DC-biased at 0.6 volts, it is understood that the DC-biasing voltage can be a slightly different voltage other than 0.6 volts provided that both diodes are DC-biased to the same voltage. The two diodes are to have the same size, and same physical construction, and are to be located in close physical location on the integrated circuit so as to minimize process variations between the two diodes.

Figures 5, 6:
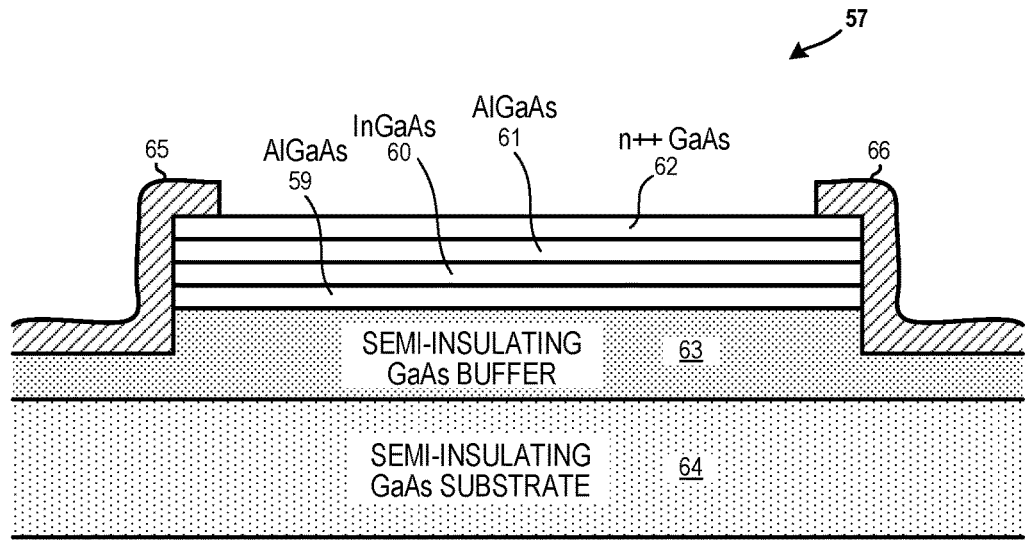
FIG. 5 is a simplified cross-sectional diagram of one embodiment of the resistor 57 of the temperature compensation circuit 56 of the precision power detector 7.
FIG. 6 is a chart that shows how temperature compensation circuit 56 improves the power reading accuracy of the power detector over temperature.

FIG. 5 is a simplified cross-sectional diagram of one type of a structure that is suitable for resistor 57. The structure is that of a pseudomorphic High Electron Mobility Transistor (pHMET) mesa resistor. There structure includes a stack of multiple thin gallium arsenide layers 59-62. This stack is disposed on a semi-insulating gallium-arsenide buffer layer 63. The structure is patterned so that the stack of thin gallium arsenide layers 59-62 are in the form of a mesa. This same type of structure is replicated elsewhere on the integrated circuit 2 and is used in those other places to realize high frequency transistors. The semi-insulating buffer layer 63 is in turn disposed on a semi-insulating gallium-arsenide substrate layer 64. The resistance of the resistor structure is between a first metal lead 65 and a second metal lead 66. The resistor structure of FIG. 5 exhibits the resistance to temperature characteristic shown in the graph of FIG. 4. At minus forty-five degrees Celsius the resistor 57 of FIG. 5 has a resistance of 271 ohms, whereas at plus eighty-five degrees Celsius the resistor 57 of FIG. 5 has a resistance of 325 ohms, where the frequency of RFOUT is constant at 30 GHz, and VDD is constant and stable at +6.0 volts.

Although rectifiers 36 and 49 are illustrated as diode symbols in FIG. 2, these rectifiers can be implemented as any suitable rectifying device such as a diode structure, as a diode-connected transistor structure, or as another PN junction of the integrated circuit 2.

FIG. 6 is a chart that shows how temperature compensation circuit 56 improves the power reading accuracy of the power detector circuit over temperature. With temperature compensation circuit 56, the power detector circuit of FIG. 2 exhibits a power reading inaccuracy of less than ±0.10 dB over a temperature range of from −45° C. to +85° C., when the power amplifier is providing +35 dBm of output power at 30 GHz. Without temperature compensation circuit 56, for operation of the circuitry under the same conditions, the power detector would exhibit a power reading inaccuracy of approximately ±0.66 dB over the same temperature range from −45° C. to +85° C. In the chart of FIG. 6, the power reading inaccuracy is inaccuracy in the voltage difference VRF (the voltage of detector output signal VDET 21 on the terminal VDET 12 subtracted from the voltage of reference signal VREF 23 on terminal VREF 13) with respect to the actual and true RF power of signal RFOUT 17 as measured at the RFOUT terminal 9.

Although an example of a power amplifier integrated circuit is set forth above that is operable at 30 GHz and that has a RF output power detector accuracy of ≤±0.1 dB over a −45° C. to +85° C. temperature range, the RF output power detector circuitry is equally usable at other frequencies in a general range of from 1 GHz to 100 GHz and above, with the same detector accuracy (≤±0.1 dB over a −45° C. to +85° C. temperature range) as long as circuit component values are adjusted appropriately.

In the description above, the term integrated circuit is used as a broad term that encompasses both a bare integrated circuit die as well as a packaged integrated circuit. Similarly, the term terminal is used as a broad term that encompasses both a pad on an integrated circuit die as well as a package terminal of a packaged integrated circuit. A terminal as the term is used here may include an integrated circuit bond pad, a package terminal, as well as a bond wire or substrate connection or other electrical connection that couples the pad to the package terminal. The term semiconductor device is a broad term that encompasses both an integrated circuit die as well as a packaged integrated circuit or a packaged multi-chip module, including the devices contained in the package as well as the outer package of any such semiconductor device.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A semiconductor device comprising:
   a terminal RFOUT;
   a power amplifier that outputs a Radio Frequency (RF) output signal onto the terminal RFOUT, wherein the RF output signal has a power magnitude at the terminal RFOUT, and wherein the RF output signal has a frequency of at least one gigahertz;
   a terminal VDET;
   a terminal VREF; and
   power detector means for outputting onto the terminal VDET a detector output signal VDET, wherein the detector output signal VDET has a Direct Current (DC) reference voltage component VREF and a DC RF output power detect component VF, wherein the means is also for outputting a reference signal VREF onto the terminal VREF, wherein the power detector means outputs the signals VDET and VREF such that a voltage difference between the reference signal VREF on the terminal VREF and the detector output signal VDET on the terminal VDET varies in proportion to the power magnitude of the RF output signal within an accuracy of less than or equal to plus or minus 0.1 decibels (≤±0.1 dB) over a temperature range of from minus forty-five degrees Celsius to plus eighty-five degrees Celsius.

2. The semiconductor device of claim 1, wherein the voltage difference between the reference signal VREF on the terminal VREF and the detector output signal VDET on the terminal VDET varies in proportion the power magnitude of the RF output signal within the accuracy of less than or equal to plus or minus 0.1 decibels (≤±0.1 dB) over the temperature range of from minus forty-five degrees Celsius to plus eighty-five degrees Celsius where the frequency of the RF output signal is anywhere in a frequency range of from twenty-eight gigahertz to thirty gigahertz.

3. A semiconductor device comprising:
   a terminal RFOUT;
   a power amplifier that outputs a Radio Frequency (RF) output signal onto the terminal RFOUT, wherein the RF output signal has a power magnitude at the terminal RFOUT, and wherein the RF output signal has a frequency of at least one gigahertz;
   a terminal VDET;
   a terminal VREF; and
   power detector means for outputting onto the terminal VDET a detector output signal VDET, wherein the detector output signal VDET has a Direct Current (DC) reference voltage component VREF and a DC RF output power detect component VF, wherein the means is also for outputting a reference signal VREF onto the terminal VREF, wherein the power detector means outputs the signals VDET and VREF such that a voltage difference between the reference signal VREF on the terminal VREF and the detector output signal VDET on the terminal VDET varies in proportion to the power magnitude of the RF output signal within an accuracy of less than or equal to plus or minus 0.1 decibels (≤±0.1 dB) over a temperature range of from minus forty-five Celsius to plus eighty-five degrees Celsius, wherein the power detector means comprises:
a voltage detector node VDET;
an RF coupling circuit that couples an RF signal onto the voltage detector node VDET;
an RF detector coupled between the voltage detector node VDET and a ground node, wherein the RF detector is taken from the group consisting of: a diode, a diode-connected transistor, a PN junction; and
a temperature compensation circuit that provides an admittance between the voltage detector node VDET and the ground node, wherein the admittance decreases with respect to increasing temperature over the temperature range of from minus forty-five degrees Celsius to plus eighty-five degrees Celsius.

4. The semiconductor device of claim 3, wherein the power detector means further comprises a low-pass filter that is coupled to the VDET node, wherein the low-pass filter outputs the detector output signal VDET onto the terminal VDET.

5. The semiconductor device of claim 3, wherein the RF detector is a diode, wherein the diode has an anode that is coupled to the voltage detector node VDET, and wherein the diode has a cathode that is coupled to the ground node.

6. The semiconductor device of claim 3, wherein the temperature compensation circuit comprises a resistor coupled in series with a capacitor, and wherein the resistor has a resistance, and wherein the resistance of the resistor has a positive temperature coefficient over a temperature range of from minus forty-five degrees Celsius to plus eighty-five degrees Celsius.

7. A semiconductor device comprising:
a power amplifier that outputs a Radio Frequency (RF) output signal, wherein the RF output signal has a frequency of at least one gigahertz;
a terminal VDET;
a terminal VREF; and
a power detector comprising:
a voltage detector node VDET;
a coupling circuit that couples an amount of the RF output signal output by the power amplifier onto the voltage detector node VDET;
a first diode having an anode and a cathode, wherein the anode of the first diode is coupled to the voltage detector node VDET, and wherein the cathode of the first diode is coupled to a ground node;
a temperature compensation circuit that provides an admittance between the voltage detector node VDET and the ground node, wherein the admittance decreases with respect to increasing temperature over the temperature range of from minus forty-five degrees Celsius to plus eighty-five degrees Celsius;
a first low-pass filter that is coupled to the VDET node, wherein the first low-pass filter outputs a detector output signal VDET onto the terminal VDET;
a voltage reference node VREF;
a second diode having an anode and a cathode, wherein the anode of the second diode is coupled to the voltage reference node VREF, and wherein the cathode of the second diode is coupled to a ground node;
a capacitor that provides a capacitance between the voltage reference node VREF and the ground node; and
a second low-pass filter that is coupled to the VREF node, wherein the second low-pass filter outputs a reference signal VREF onto the terminal VREF.

8. The semiconductor device of claim 7, wherein the temperature compensation circuit comprises a pseudomorphic High Electron Mobility Transistor (pHMET) mesa resistor.

9. The semiconductor device of claim 7, further comprising:
a first bias resistor that is coupled between a Direct Current (DC) supply voltage node and the voltage detector node VDET; and
a second bias resistor that is coupled between the DC supply voltage node and the voltage reference node VREF.

10. A semiconductor device comprising:
a power amplifier having an output lead, wherein the power amplifier outputs a Radio Frequency (RF) signal of at least one gigahertz onto the output lead; and
a power detector circuit that is coupled to the output lead of the power amplifier; wherein the power detector circuit outputs a detector output signal VDET, wherein a voltage magnitude of the detector output signal VDET is indicative of a power magnitude of the RF signal output by the power amplifier, wherein the detector output signal VDET decreases as a power of the RF signal increases, and wherein the detector output signal VDET increases as the power of the RF signal decreases, and wherein the power detector circuit comprises:
a voltage detector node;
a bias circuit that biases the voltage detector node to a Direct Current (DC) voltage;
an RF detector diode having an anode and a cathode, wherein the anode is coupled to the voltage detector node, and wherein the cathode is coupled to a ground node; and
a temperature compensation circuit that provides an admittance between the voltage detector node and the ground node, wherein the admittance decreases with respect to increasing temperature over a temperature range.

11. The semiconductor device of claim 10, wherein the power detector circuit further comprises a filter that is coupled to the voltage detector node, wherein the filter filters a signal present on the voltage detector node so as to generate and to output the detector output signal VDET.

12. The semiconductor device of claim 10, wherein the semiconductor device comprises an integrated circuit, and wherein the power detector circuit outputs the detector output signal VDET onto a terminal of the integrated circuit.

13. A semiconductor device comprising:
a power amplifier having an output lead, wherein the power amplifier outputs a Radio Frequency (RF) signal of at least one gigahertz onto the output lead; and
a power detector circuit that is coupled to the output lead of the power amplifier; wherein the power detector circuit outputs a detector output signal VDET, wherein a voltage magnitude of the detector output signal VDET is indicative of a power magnitude of the RF signal output by the power amplifier, and wherein the power detector circuit comprises:
a voltage detector node;
a bias circuit that biases the voltage detector node to a Direct Current (DC) voltage;
an RF detector diode having an anode and a cathode, wherein the anode is coupled to the voltage detector node, and wherein the cathode is coupled to a ground node; and a temperature compensation circuit that provides an admittance between the voltage detector node and the ground node, wherein the admittance decreases with respect to increasing temperature over a temperature range, wherein the voltage magnitude of the detector output signal VDET becomes more negative as the power of the RF signal increases, and wherein the voltage magnitude of the detector output signal VDET becomes less negative as the power of the RF signal decreases.

14. The semiconductor device of claim 10, wherein the temperature compensation circuit comprises a resistor having a positive resistance to temperature coefficient.

15. The semiconductor device of claim 10, wherein the semiconductor device is a packaged power amplifier integrated circuit comprising an integrated circuit die and an integrated circuit package.

16. The semiconductor device of claim 10, wherein the temperature compensation circuit comprises a mesa structure, wherein the mesa structure comprises gallium and arsenic.

17. The semiconductor device of claim 10, wherein the semiconductor device comprises an integrated circuit, wherein the power detector circuit also outputs a reference signal VREF onto a terminal of the integrated circuit.

18. The semiconductor device of claim 10, wherein the power detector circuit further comprises an RF coupling circuit, wherein the RF coupling circuit couples an amount of the RF signal from the output lead of the power amplifier and onto the voltage detector node.

19. The semiconductor device of claim 10, wherein the power detector circuit further comprises a reference diode, wherein the reference diode is substantially structurally identical to the RF detector diode.

20. The semiconductor device of claim 10, wherein the RF detector diode is part of a diode-connected transistor.

21. The semiconductor device of claim 1, wherein the semiconductor device is a packaged device that comprises a package and an integrated circuit.

22. A method comprising:

outputting a Radio Frequency (RF) output signal from a power amplifier onto a terminal RFOUT of an integrated circuit, wherein the RF output signal has a power magnitude at the terminal RFOUT, and wherein the RF output signal has a frequency of at least one gigahertz;

outputting a signal VDET from a power detector of the integrated circuit onto a VDET terminal of the integrated circuit, wherein the signal VDET has a first Direct Current (DC) reference voltage component VREF and a second DC RF output power detect component VF, wherein a magnitude of the DC RF output power detect component VF varies in inverse proportion to the power magnitude of the RF output signal; and outputting a signal VREF from the power detector onto a VREF terminal of the integrated circuit, wherein the signals VREF and VDET are generated so that the voltage difference between the signals VREF and VDET varies in proportion to the power magnitude of the RF output signal within an accuracy of less than or equal to plus or minus 0.1 decibels over a temperature range of from minus forty-five degrees Celsius to plus eighty-five degrees Celsius.

23. The method of claim 22, wherein the power detector comprises a VDET node, an RF detector coupled between the VDET node and a ground node, a filter coupled to the VDET node and to the VDET terminal, and a temperature compensation circuit, wherein the method further comprises:

conducting a temperature compensation current from the VDET node, through the temperature compensation circuit, and to the ground node, wherein the temperature compensation circuit has a decreasing admittance with respect to increasing temperature.

* * * * *